US011781917B2

(12) United States Patent
Chen

(10) Patent No.: US 11,781,917 B2
(45) Date of Patent: Oct. 10, 2023

(54) TEMPERATURE SENSOR CIRCUIT AND METHOD THEREOF

(71) Applicant: Nanya Technology Corporation, New Taipei (TW)

(72) Inventor: Chih-Jen Chen, Kaohsiung (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 513 days.

(21) Appl. No.: 17/135,464

(22) Filed: Dec. 28, 2020

(65) Prior Publication Data

US 2022/0205846 A1    Jun. 30, 2022

(51) Int. Cl.
  *G01K 3/10*    (2006.01)
  *H01L 21/67*   (2006.01)
  *G01K 1/02*    (2021.01)

(52) U.S. Cl.
  CPC ............ *G01K 3/10* (2013.01); *G01K 1/026* (2013.01); *H01L 21/67248* (2013.01)

(58) Field of Classification Search
  CPC ...... G01K 3/10; G01K 1/026; G01K 2211/00; G01K 3/005; G01K 7/425; H01L 21/67248
  See application file for complete search history.

(56) References Cited

U.S. PATENT DOCUMENTS

2021/0218085 A1*   7/2021  Ge .................... H01M 10/486

* cited by examiner

*Primary Examiner* — Robert G Bachner
(74) *Attorney, Agent, or Firm* — Birch, Stewart, Kolasch & Birch, LLP

(57) ABSTRACT

This invention provides a temperature sensor circuit and its operation method. The temperature sensor circuit includes a temperature sensor, a temperature comparator, a plurality of temperature sensor enable clocks with different clock cycles and a clock selection circuit. The temperature sensor detects a temperature of an Integrated circuit and sending a signal indicative of the temperature. The temperature comparator executes a comparison between the temperature of the Integrated circuit and a predetermined temperature setting upon receiving the signal indicative of the temperature and sending an output according to the comparison. Upon receiving the output, the clock selection circuit provides one of the temperature sensor enable clocks according to the output to enable the temperature sensor. The temperature detection cycle of the temperature sensor is thus adjustable to save the temperature sensor power.

6 Claims, 9 Drawing Sheets

| Setting value | Temperature (°C) |
|---|---|
| <11111011> | 80 |
| <11111100> | 81 |
| <11111101> | 82 |
| <11111110> | 83 |
| <11111111> | 84 |
| <00000000> | 85 |
| <00000001> | 86 |
| <00000010> | 87 |
| <00000011> | 88 |
| <00000100> | 89 |
| <00000101> | 90 |

Fig.4

| Temperature (°C) | TS enable clock type | Temperature sensor enable cycle (ms) | Refresh mode |
|---|---|---|---|
| ≤79 | TS enable clock 2 | 64 | Normal mode |
| 80 | TS enable clock 1 | 32 | Normal mode |
| 81 | TS enable clock 1 | 32 | Normal mode |
| 82 | TS enable clock 1 | 32 | Normal mode |
| 83 | TS enable clock 1 | 32 | Normal mode |
| 84 | TS enable clock 1 | 32 | Normal mode |
| 85 | TS enable clock 1 | 32 | Normal mode |
| 86 | TS enable clock 1 | 32 | Extended temperature mode |
| 87 | TS enable clock 1 | 32 | Extended temperature mode |
| 88 | TS enable clock 1 | 32 | Extended temperature mode |
| 89 | TS enable clock 1 | 32 | Extended temperature mode |
| 90 | TS enable clock 1 | 32 | Extended temperature mode |
| ≥91 | TS enable clock 2 | 64 | Extended temperature mode |

Fig.5

| Temperature (°C) | TS enable clock type | Temperature sensor enable cycle (ms) | Refresh mode |
|---|---|---|---|
| ≦74 | TS enable clock 1 | 128 | Normal mode |
| 75 | TS enable clock 2 | 64 | Normal mode |
| 76 | TS enable clock 2 | 64 | Normal mode |
| 77 | TS enable clock 2 | 64 | Normal mode |
| 78 | TS enable clock 2 | 64 | Normal mode |
| 79 | TS enable clock 2 | 64 | Normal mode |
| 80 | TS enable clock 3 | 32 | Normal mode |
| 81 | TS enable clock 3 | 32 | Normal mode |
| 82 | TS enable clock 3 | 32 | Normal mode |
| 83 | TS enable clock 3 | 32 | Normal mode |
| 84 | TS enable clock 3 | 32 | Normal mode |
| 85 | TS enable clock 3 | 32 | Normal mode |
| 86 | TS enable clock 3 | 32 | Extended temperature mode |
| 87 | TS enable clock 3 | 32 | Extended temperature mode |
| 88 | TS enable clock 3 | 32 | Extended temperature mode |
| 89 | TS enable clock 3 | 32 | Extended temperature mode |
| 90 | TS enable clock 3 | 32 | Extended temperature mode |
| 91 | TS enable clock 2 | 64 | Extended temperature mode |
| 92 | TS enable clock 2 | 64 | Extended temperature mode |
| 93 | TS enable clock 2 | 64 | Extended temperature mode |
| 94 | TS enable clock 2 | 64 | Extended temperature mode |
| 95 | TS enable clock 2 | 64 | Extended temperature mode |
| ≧96 | TS enable clock 1 | 128 | Extended temperature mode |

Fig. 8

TEMPERATURE SENSOR CIRCUIT AND METHOD THEREOF

BACKGROUND OF THE INVENTION

Field of the Invention

The present invention relates to a semiconductor integrated circuit and, more particularly, to a semiconductor temperature sensor circuit with an adjustable temperature sensing cycles.

Description of the Prior Art

DRAM (Dynamic Random Access Memory) is a volatile semiconductor memory. In order to avoid the loss of data stored in the DRAM, the data are refreshed on a periodic basis. However, the loss of the data stored in the DRAM becomes faster and faster with the temperature of the DRAM increases. As the temperature of DRAM raises, the refresh rate implemented on a DRAM array increases to retain the data stored in DRAM at high temperatures and thus leading to increase of the current consumption of DRAM.

To reduce power consumption of DRAM, a temperature sensor is built in a DRAM module to detect the temperature of the DRAM periodically, and the refresh rate implemented on the DRAM array is varied based on the detected temperature. The refresh rate increases at high temperatures and decreases at low temperatures.

FIG. 1 is a prior art temperature sensor circuit 10 built in a DRAM module. A TS enable clock 102 sends an enable signal "TSEN" to control turn on/off of the temperature sensor 104. As an example, the temperature sensor 104 detects a temperature of the DRAM array (not shown) every 32 milliseconds when the clock cycle of the TS enable clock 102 is 32 milliseconds. Once the temperature sensor 104 detects the temperature of the DRAM array, the temperature sensor 104 sends a signal indicative of the temperature TS<n:0> to a DRAM controller (not shown). The DRAM controller sets the refresh rate for the DRAM array based on the detected temperature converted from the signal indicative of the temperature TS<n:0>. The TS enable clock 102 with a constant clock cycle enables the temperature sensor 104 to detect the temperature of the DRAM array. The detection period of the temperature sensor 104 is 200 microseconds, for example. The temperature sensor 104 itself consumes current during the temperature detection period. There is a need to reduce the power consumption of the temperature sensor built in the memory chip such as DRAM.

SUMMARY OF THE INVENTION

It is accordingly an object of the present invention to reduce enable times of a temperature sensor to save power.

It is yet an object of the present invention to adjust enable times of the temperature sensor based on a temperature of an integrated circuit (IC).

It is further an object of the present invention to increase enable times of the temperature sensor during a predetermined temperature division close to a threshold temperature that requires refresh rate of a memory chip switched and decrease enable times of the temperature sensor beyond the predetermined temperature division so as to reduce power consumption of the temperature sensor.

One aspect of the present invention is to provide a temperature sensor circuit including a temperature sensor, a temperature comparator, a plurality of temperature sensor enable clocks with different clock cycles and a clock selection circuit. The temperature sensor detects a temperature of an IC and sends a signal indicative of the temperature detected from the IC. The temperature comparator executes a comparison between the temperature of the IC and a predetermined temperature setting upon receiving the signal indicative of the temperature of the IC and sends an output according to the comparison. The clock selection circuit receives the output from the temperature comparator and then provides one of the temperature sensor enable clocks according to the output to enable the temperature sensor to detect a current temperature of the IC.

In an implementation of the present invention, when the temperature of the IC is beyond the predetermined temperature setting, the temperature sensor is enabled by the temperature sensor enable clock with a longer clock cycle than that for enabling the temperature sensor when the temperature of the IC falls within the predetermined temperature setting.

In an implementation of the present invention, the predetermined temperature setting is a mapping table of setting values vs. temperatures, in which the setting value correlates to the signal indicative of the temperature.

In an implementation of the present invention, the clock selection circuit is a multiplexer.

Another aspect of the present invention is to provide a method for operating a temperature sensor including steps of detecting a temperature of an IC and sending a signal indicative of the temperature; comparing the signal indicative of the temperature with a predetermined temperature setting and accordingly sending an output; and sending a temperature senor enable clock with a predetermined clock cycle to enable the temperature sensor to detect a current temperature of the IC, in which the predetermined clock cycle of the temperature sensor enable clock is selected according to the output.

In an implementation of the present invention, when the temperature of the Integrated circuit is beyond the predetermined temperature setting, the predetermined clock cycle for enabling the temperature sensor is longer than that for enabling the temperature sensor when the temperature of the Integrated circuit falls within the predetermined temperature setting.

Yet another aspect of the present invention is to provide a method for adjusting a temperature sensing cycle of a temperature sensor including steps of detecting a temperature of an IC; determining a predetermined temperature division according to the temperature detected from the IC; and adjusting a temperature sensing cycle of the temperature sensor according to the predetermined temperature division.

In an implementation of the present invention, when the predetermined temperature division is beyond a predetermined temperature setting range, the temperature sensing cycle is longer than that when the predetermined temperature division fits the predetermined temperature setting range.

In an implementation of the present invention, the IC is a memory chip, for example a DRAM module.

BRIEF DESCRIPTION OF THE DRAWINGS

Related aspects and advantages of the invention will become apparent and more readily appreciated from the following detailed description of the invention, taken in conjunction with the accompanying drawings.

FIG. 4 is a schematic view of a mapping table built in a temperature comparator of the temperature sensor circuit of FIG. 2.

FIG. 5 is a diagram illustrating a relation for temperature sensor enable cycles vs. temperatures of a DRAM module provided with the temperature sensor circuit of FIG. 2.

FIG. 8 is a diagram illustrating a relation for temperature sensor enable cycles vs. temperatures of a DRAM module provided with the temperature sensor circuit of FIG. 7.

DETAILED DESCRIPTION OF THE PREFERRED EMBODIMENTS

Various embodiments and aspects of the invention will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present invention.

According to DDR5 JEDEC standard, the refresh rate at the temperature of DRAM exceeds 85° C. is twice the refresh rate at the temperature of DRAM equal to/or less than 85° C. It is favorable to precisely detect the temperature fluctuation of DRAM around 85° C., for example from 80° C. to 90° C., to timely update the refresh rate of DRAM to ensure data retention in DRAM at high temperatures. Under such a scenario, a temperature sensor for detecting the temperature of DRAM may be enabled with a clock cycle of 32 milliseconds at the temperature range from 80° C. to 90° C., while enabled with a clock cycle of 64 milliseconds beyond the temperature range from 80° C. to 90° C. The enable times of the temperature sensor thus decrease with temperature to save power itself.

The present invention provides some practicable means regarding the temperature sensor circuit as embodied below to perform the design concept of the above. In other words, the present invention proposes the clock cycle to enable the temperature sensor may increase or become longer as the temperature of an Integrated circuit such as a memory chip is beyond a presetting temperature range to reduce the power consumption of the temperature sensor.

Figure 1:
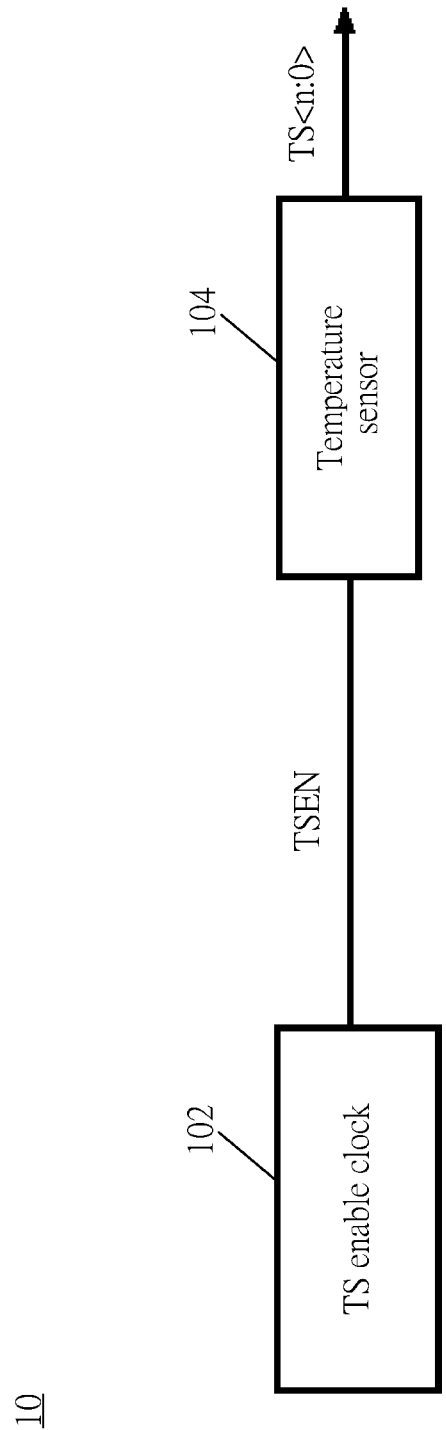
FIG. 1 is a schematic diagram of a prior art temperature sensor circuit.
Figure 2:
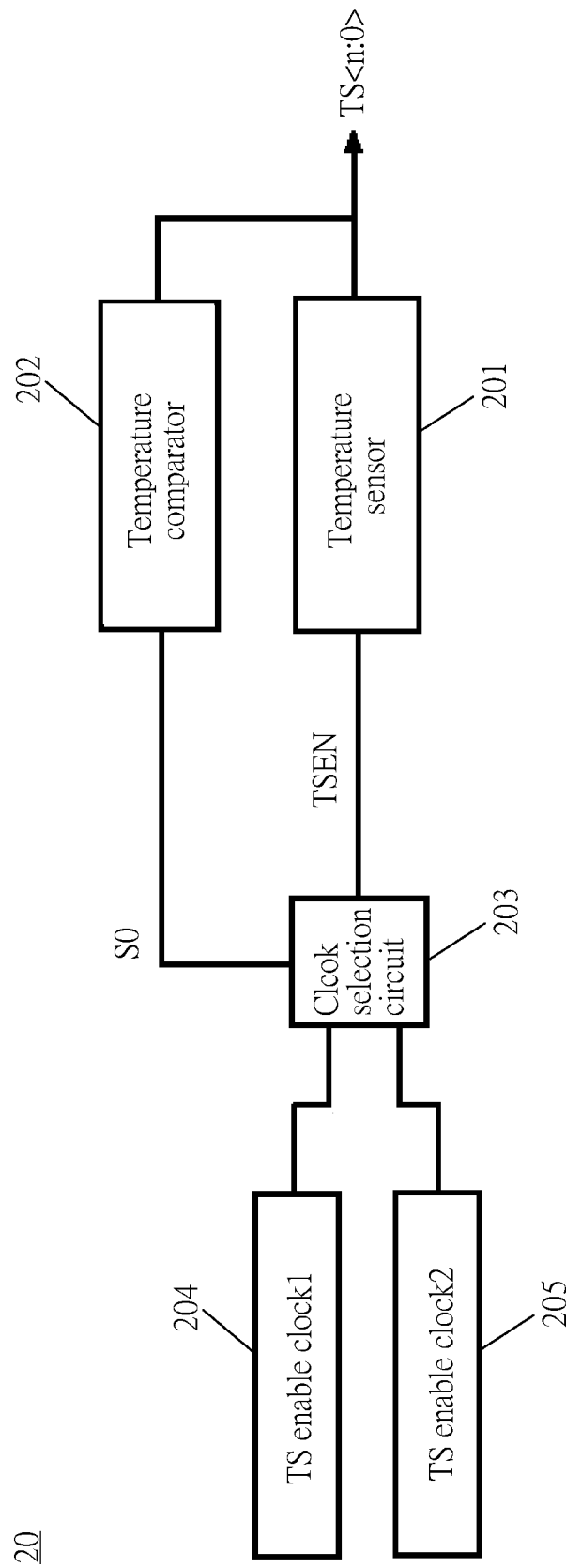
FIG. 2 is a schematic diagram of a temperature sensor circuit according to a first embodiment of the present invention.

FIG. 2 is a schematic diagram of a temperature sensor circuit according to a first embodiment of the present invention. In the first embodiment, the temperature sensor circuit 20 includes a temperature sensor 201, a temperature comparator 202, a clock selection circuit 203, a first temperature sensor enable clock (briefly named TS enable clock1) 204 and a second temperature sensor enable clock (briefly named TS enable clock2) 205. The first temperature sensor enable clock 204 and the second temperature sensor enable clock 205 have different clock cycles. In the case of DRAM, the first temperature sensor enable clock 204 may have a clock cycle of 32 milliseconds, and the second temperature sensor enable clock 205 may have a clock cycle of 64 milliseconds.

Figure 3:
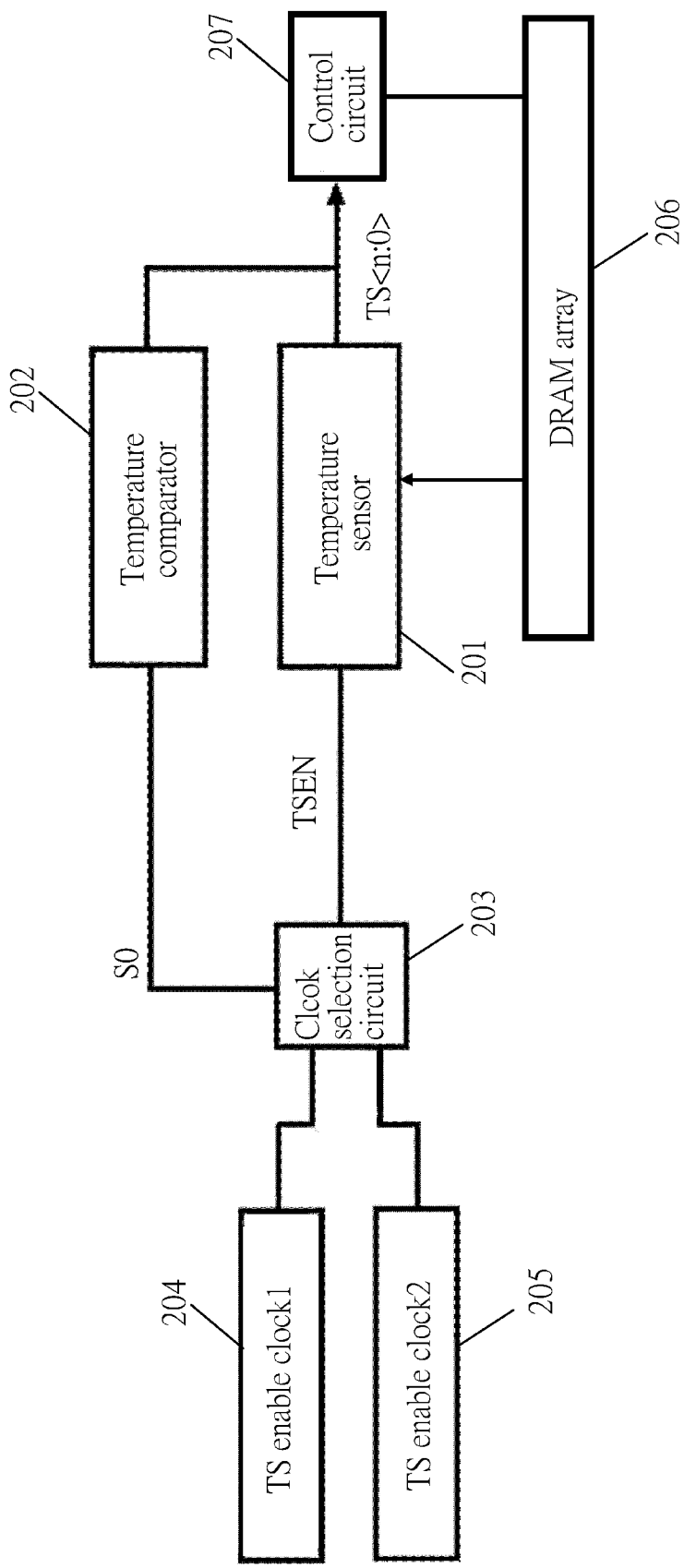
FIG. 3 is a schematic diagram of a DRAM module provided with the temperature sensor circuit of FIG. 2.

FIG. 3 is a schematic diagram of a DRAM module provided with the temperature sensor circuit 20. The temperature sensor 201 upon receiving an enable signal "TSEN" detects a temperature of a DRAM array 206 and sends a signal indicative of the temperature designated as TS<n:0>. In an implementation of the present invention, TS<n:0> may be a 8-bit digital form. A control circuit 207 reads the signal indicative of the temperature TS<n:0> and accordingly decides the refresh rate of the DRAM array 206 that maybe fit the requirement of JEDEC standard. The temperature comparator 202 receives the signal indicative of the temperature TS<n:0> and determines whether the signal indicative of the temperature TS<n:0> correlates to a predetermined temperature setting built in the temperature comparator 202. In an implementation of the present invention, the predetermined temperature setting may be a mapping table of setting values vs. temperatures shown in FIG. 4. The setting values may be a 8-bit digital form, for example <00000000> represents 85° C., <00000001> represents 86° C., and <11111111> represents 84° C., etc, as shown in FIG. 4. The 8-bit setting values corresponding to individual temperatures of FIG. 4 are illustrative but not limiting the present invention. One skilled person in the art would learn that the 8-bit setting values can be set as desired. When the signal indicative of the temperature TS<n:0> correlates to the predetermined temperature setting of FIG. 4, for example the signal indicative of the temperature TS<n:0> is <00000001> that correlates to the predetermined temperature setting of FIG. 4, the temperature comparator 202 sends an output designated as S0, for example in a digital form of "0". The clock selection circuit 203, for example a multiplexer, receives the output as "0" and accordingly turns on the first temperature sensor enable clock 204. The first temperature sensor enable clock 204 enables the temperature sensor 201 with the clock cycle of 32 milliseconds. When the signal indicative of the temperature TS<n:0> fails to correlate to the predetermined temperature setting of FIG. 4, the temperature comparator 202 sends an output designated as S0 in a digital form of "1". The clock selection circuit 203 receives the output as "1" and accordingly turns on the second temperature sensor enable clock 205. The second temperature sensor enable clock 205 enables the temperature sensor 201 with the clock cycle of 64 milliseconds. Please refer to FIG. 5, in an implementation of the present invention, the temperature sensor 201 is enabled with the clock cycle of 32 milliseconds when the temperature of DRAM such as DDR5 in the range of 80° C. to 90° C. While the temperature sensor 201 is enabled with the clock cycle of 64 milliseconds when the temperature of DRAM is beyond the range of 80° C. to 90° C. Therefore, the temperature sensor 201 can frequently detect the temperature fluctuation of DRAM when the temperature is close to the threshold temperature, for example 85° C. for DDR5 to ensure timely update the refresh rate of DRAM. The threshold temperature herein means the temperature at which the refresh mode requires switched. The temperature sensor 201 can detect the temperature of DRAM with fewer enable times beyond the temperature range close to the threshold temperature. Taken FIG. 5 as an example, the temperature sensor 201 can detect the temperature fluctuation of DRAM every 32 milliseconds in the temperature range from 80° C. to 90° C., and detects the temperature of DRAM every 64 milliseconds at the temperature equal to/or lower than 79° C. and the temperature equal to/or higher than 91° C. as well. The temperature sensor 201 may operate with less power consumption.

Figure 6:
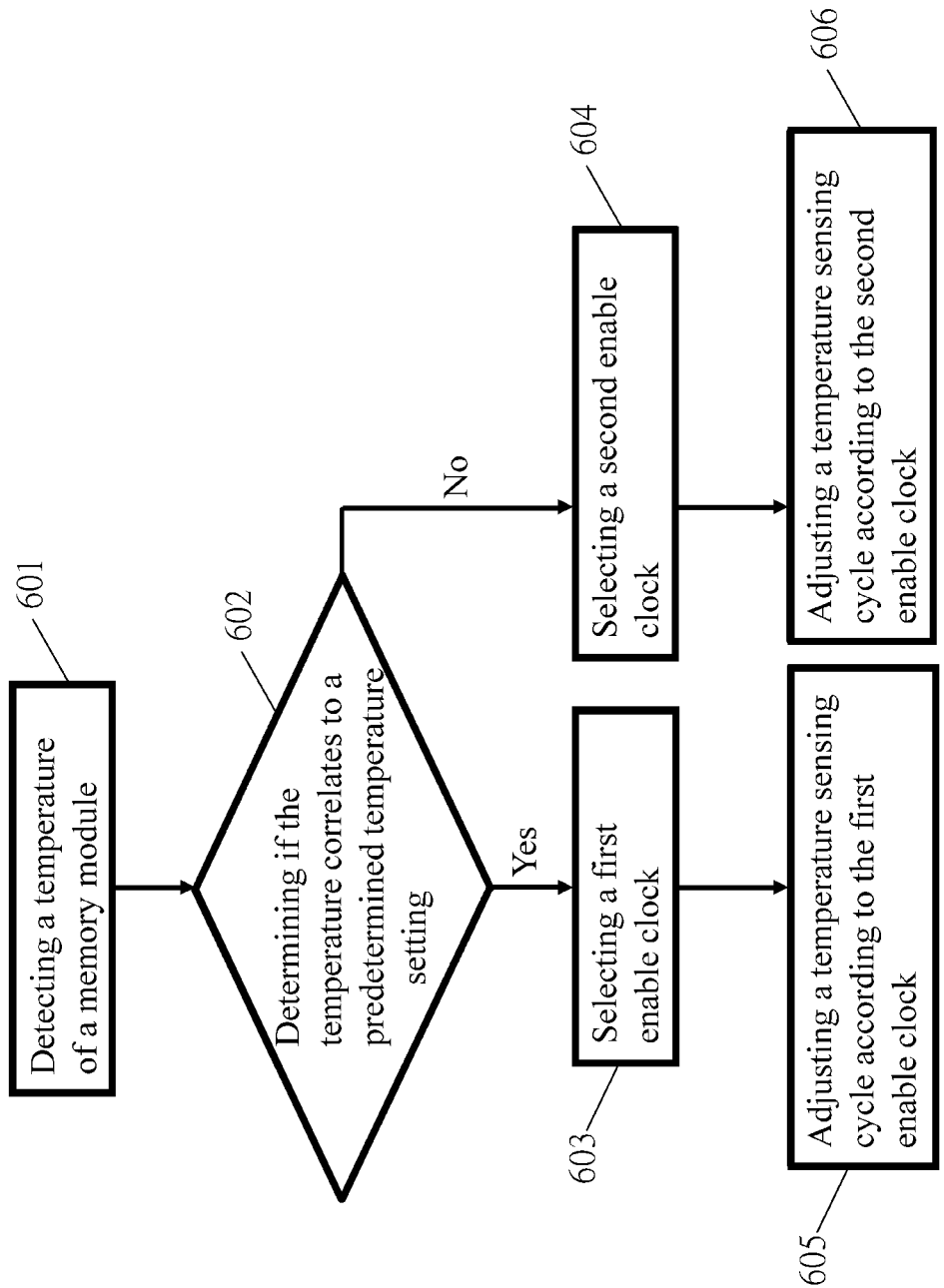
FIG. 6 is a schematic process flow of an operation method of the temperature sensor circuit of FIG. 2.

FIG. 6 is an example process flow illustrating a method for detecting a temperature of a memory chip with the temperature sensor circuit 20. At step 601, the temperature sensor 201 detects a temperature of a memory chip for example a DRAM, upon receiving an enable signal. At step 602, determining if the temperature correlates to a predetermined temperature setting. If yes, go to step 603, selecting a first enable clock. Then, go to step 605, adjusting a temperature sensing cycle of the temperature sensor 201 according to the first enable clock. If not, go to step 604, selecting a second enable clock. Then, go to step 606, adjusting a temperature sensing cycle of the temperature sensor 201 according to the second enable clock.

Depending on the demand of the memory chip, the present invention can program to enable the temperature sensor with different clock cycles at more temperature divisions to save more power. For DDR5 memory, JEDEC standard requires the refresh rate of DRAM at the temperature higher than 85° C. is twice the refresh rate at the temperature ≤85° C. Preferably, the temperature fluctuation of DRAM is detected with less time interval during the temperature division from 80° C. to 90° C. to ensure the refresh rate can be timely updated to retain data stored in DRAM at higher temperatures, and detected with more time interval at other temperature divisions to reduce power consumption of the temperature sensor. Hence, the temperature sensor may be enabled every 32 milliseconds in the temperature range from 80° C. to 90° C., enabled every 64 milliseconds in the range from 75° C. to 79° C. and in the range from 91° C. to 95° C., and enabled every 128 milliseconds at the temperature equal to/or lower than 74° C. as well as at the temperature equal to/or higher than 96° C., as shown in FIG. 8.

Figure 7:
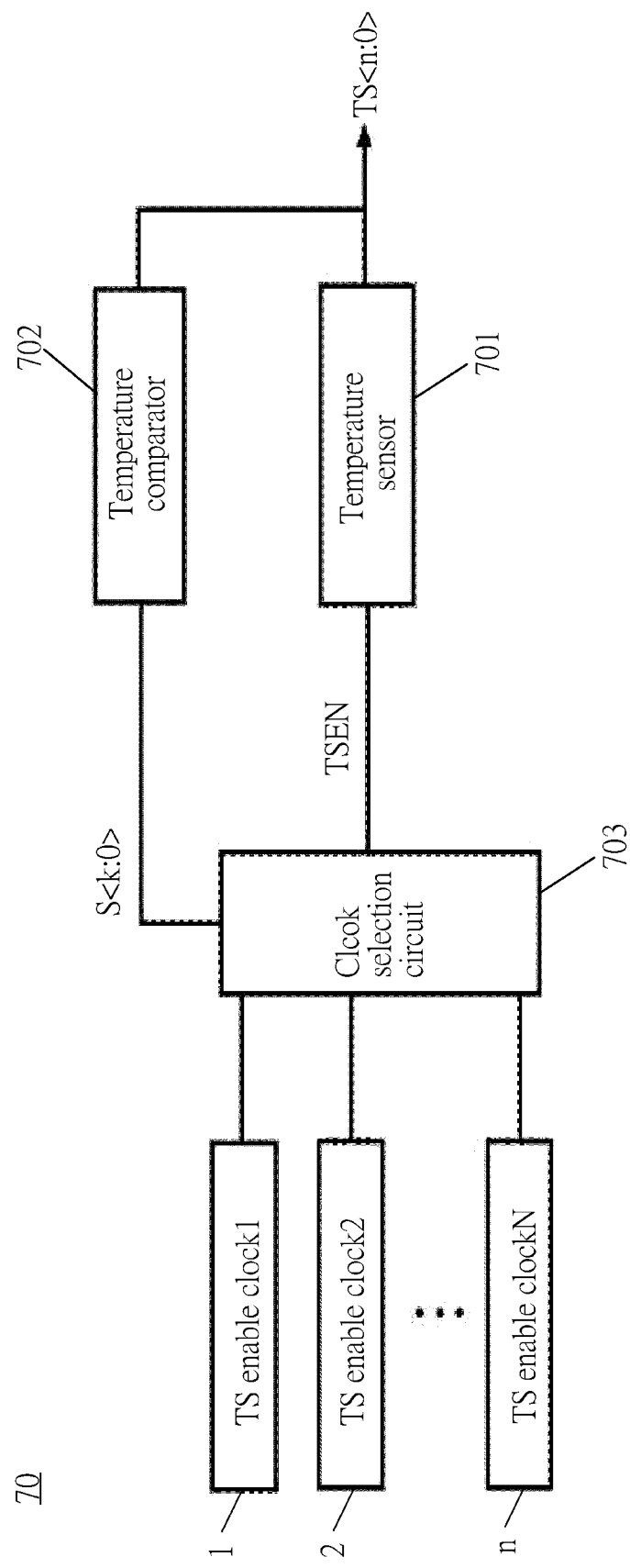
FIG. 7 is a schematic diagram of a temperature sensor circuit according to a second embodiment of the present invention.

FIG. 7 is a schematic diagram of a temperature sensor circuit 70 suitable for more temperature sensing divisions according to a second embodiment of the present invention. The temperature sensor circuit 70 includes a temperature sensor 701, a temperature comparator 702, a clock selection circuit 703, and several temperature sensor enable clocks 1, n, respectively with different clock cycles and respectively for different temperature divisions of a memory chip. The temperature sensor circuit 70 has more temperature sensor enable clocks units than the temperature sensor circuit 20 has. In other words, the temperature sensor circuit 70 can be suitable for a memory chip requires fine temperature sensing divisions, as illustrative in FIG. 8. Besides, the temperature sensor 701, the temperature comparator 702, the clock selection circuit 703 and the temperature sensor enable circuits 1, 2, . . . , n are implemented in the same way as those of the temperature sensor circuit 20.

Figure 9:
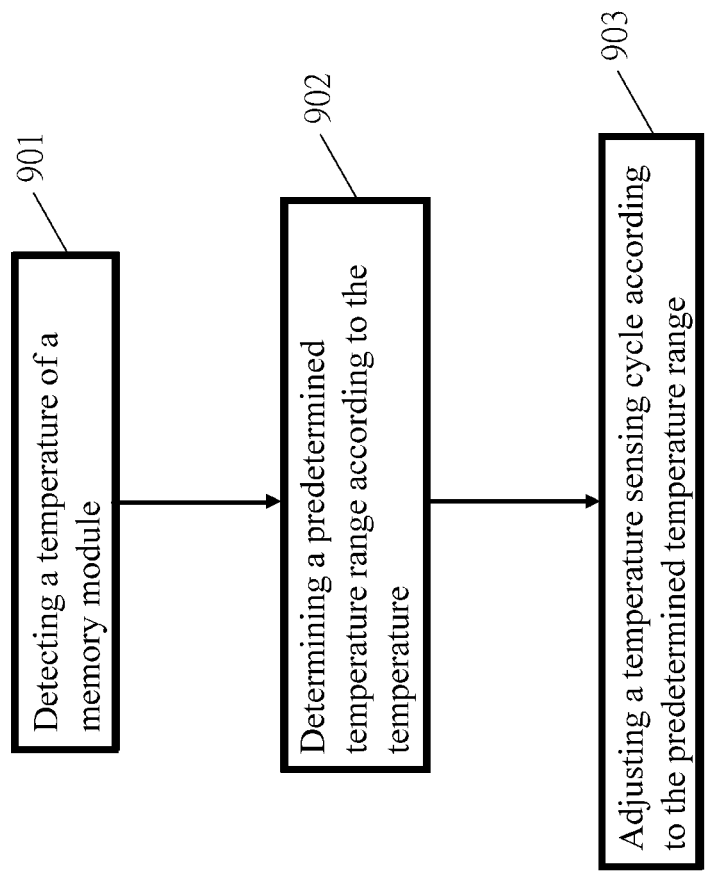
FIG. 9 is a schematic process flow of an operation method of the temperature sensor circuit of FIG. 7.

FIG. 9 is an example process flow illustrating a method for detecting a temperature of a memory chip with the temperature sensor circuit 70. At step 901, the temperature sensor 701 detects a temperature of a memory chip for example a DRAM, upon receiving an enable signal and sending a signal indicative of the temperature TS<n:0>. At step 902, the comparator 702 receives the signal indicative of the temperature TS<n:0> and determining a predetermined temperature division according to the temperature converted from the signal indicative of the temperature TS<n:0>, and sending an output S<k:0> corresponding to the predetermined temperature division. At step 903, the clock selection circuit 703 turns on one of the temperature sensor enable clocks 1, 2, . . . , n corresponding to the predetermined temperature division to enable the temperature sensor 701. Therefore, the programming for temperature sensing cycles as shown in FIG. 8 can be practiced with the method above.

The above-mentioned embodiments of the present invention are exemplary and not intended to limit the scope of the present invention. Various variation or modifications made without departing from the spirit of the present invention and achieving equivalent effects shall fall within the scope of claims of the present invention.

What is claimed is:

1. A temperature sensor circuit, comprising:
   a temperature sensor for detecting a temperature of an Integrated circuit and sending a signal indicative of the temperature detected from the Integrated circuit;
   a temperature comparator for executing a comparison between the temperature of the Integrated circuit and a predetermined temperature setting upon receiving the signal indicative of the temperature of the Integrated circuit and sending an output according to the comparison;
   a plurality of temperature sensor enable clocks with different clock cycles for enabling the temperature sensor; and
   a clock selection circuit receiving the output from the temperature comparator and providing one of the temperature sensor enable clocks according to the output.

2. The temperature sensor circuit of claim 1, wherein when the temperature of the Integrated circuit is beyond the predetermined temperature setting, the temperature sensor is enabled by the temperature sensor enable clock with a longer clock cycle than that for enabling the temperature sensor when the temperature of the Integrated circuit falls within the predetermined temperature setting.

3. The temperature sensor circuit of claim 1, wherein the predetermined temperature setting is a mapping table of setting value vs. temperature, in which the setting value correlates to the signal indicative of the temperature.

4. The temperature sensor circuit of claim 1, wherein the clock selection circuit is a multiplexer.

5. The temperature sensor circuit of claim 1, wherein the Integrated circuit is a memory chip.

6. The temperature sensor circuit of claim 5, wherein the memory chip is a DRAM.

* * * * *